United States Patent
Singh et al.

(10) Patent No.: US 6,507,474 B1
(45) Date of Patent: Jan. 14, 2003

(54) USING LOCALIZED IONIZER TO REDUCE ELECTROSTATIC CHARGE FROM WAFER AND MASK

(75) Inventors: Bhanwar Singh, Morgan Hill, CA (US); Ramkumar Subramanian, San Jose, CA (US); Khoi A. Phan, San Jose, CA (US); Bryan K. Choo, Mountain View, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 136 days.

(21) Appl. No.: 09/597,126

(22) Filed: Jun. 19, 2000

(51) Int. Cl.$^7$ ............................................. H01T 23/00
(52) U.S. Cl. ..................... 361/230; 361/225; 361/220; 361/212
(58) Field of Search ................................. 361/213, 212, 361/220, 230, 111, 91, 118, 225

(56) References Cited

U.S. PATENT DOCUMENTS

| 4,110,810 A | 8/1978 | Moore et al. ............... 361/213 |
| 4,642,728 A | 2/1987 | Unger ........................ 361/213 |
| 5,057,966 A | 10/1991 | Sakata et al. ................ 361/213 |

*Primary Examiner*—Stephen W. Jackson
(74) *Attorney, Agent, or Firm*—Amin & Turocy, LLP

(57) ABSTRACT

One aspect of the present invention elates to a method of reducing electrostatic charges on a patterned photoresist to improve evaluation of the developed photoresist, involving the steps of evaluating the patterned photoresist to determine if electrostatic charges exist thereon; positioning an ionizer near the patterned photoresist, the ionizer generating ions thereby reducing the electrostatic charges on the patterned photoresist; and evaluating the patterned photoresist with an electron beam. Another aspect of the present invention relates to a system for reducing electrostatic charges on a patterned photoresist, containing a charge sensor for determining if electrostatic charges exist on the patterned photoresist and measuring the electrostatic charges; an ionizer positioned near the patterned photoresist having electrostatic charges thereon for reducing the electrostatic charges on the patterned photoresist; a controller for setting at least one of time of ion generation and amount of ion generation by the ionizer, the controller coupled to the charge sensor and the ionizer; and a scanning electron microscope or an atomic force microscope for evaluating the patterned photoresist having reduced electrostatic charges thereon with an electron beam.

18 Claims, 10 Drawing Sheets

USING LOCALIZED IONIZER TO REDUCE ELECTROSTATIC CHARGE FROM WAFER AND MASK

TECHNICAL FIELD

The present invention generally relates to improved lithography processing by using a feedback system to screen and treat structures with electrostatic charges. In particular, the present invention relates to determining if electrostatic charges on developed photoresists and masks exist, and if so, reducing electrostatic charges on developed photoresists and masks using an ionizer.

BACKGROUND ART

Microlithography processes for making miniaturized electronic components, such as in the fabrication of computer chips and integrated circuits, involve using photoresists and masks. Generally, a coating or film of a photoresist is applied to a substrate material, such as a silicon wafer used for making integrated circuits. The substrate may contain any number of layers or devices thereon.

The photoresist coated substrate is baked to evaporate any solvent in the photoresist composition and to fix the photoresist coating onto the substrate. The baked coated surface of the substrate is next subjected to selective radiation; that is, an image-wise exposure to radiation. This radiation exposure causes a chemical transformation in the exposed areas of the photoresist coated surface. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist. Many developer solutions contain water and a base, such as water and a hydroxide compound.

Treating a selectively exposed photoresist with a developer conventionally involves depositing the liquid developer solution over the photoresist clad substrate and spinning the substrate whereby the liquid developer solution and dissolved areas of the photoresist are removed from the substrate by centrifugal forces. A rinsing solution, typically water, is then deposited over the photoresist clad substrate and the substrate is spun again to remove the water and any debris solubilized by the water. Spinning the substrate is a convenient and inexpensive method of removing materials from substrate. However, electrostatic charges build up on the developed photoresist during the development and water rinse cycles.

Negative charges are particularly encountered on developed photoresists, notwithstanding whether the photoresist is patterned over a wafer or a mask. While the causes of this phenomenon are not completely understood, it is believed that electrostatic charges and/or resist developer and/or deionized water rinse contribute to charge accumulation. Charge accumulation on developed photoresists can be as high as 300–400 volts, and it is typically negative. Electrostatic charges also build up on the developed photoresist that are evaluated using a scanning electron microscope (SEM) or an atomic force microscope (AFM).

Negative charge accumulation on a developed photoresist presents a number of problems. One notable problem is that measurement of various resist features, such as linewidth and profiling, is rendered inaccurate. Especially when using a SEM or an AFM, it is difficult to obtain accurate data. This is because SEMs and AFMs use an electron beam for generating images (both in projection and detection). The electron beam from the SEM or AFM may be repulsed by the negative charge accumulated on the photoresist or mask. The degree of repulsion or deviation from an ideal direction is dependent upon the magnitude of the accumulated negative charge.

Another aspect of this problem is that secondary electrons emitted from the surface of the features under measurement (such as the patterned photoresist) are reduced due to negative charge accumulation. As a result, the secondary electron signal received at the detector does not represent the correct signal (as in instances where electrostatic charges do not exist on the patterned photoresist). Hence, in the case of a linewidth measurement having a developed photoresist with negative charge accumulation thereon, the SEM does not accurately measure the width because the secondary electron signal is reduced.

This phenomenon is shown in FIGS. 1 and 2. Referring to FIG. 1, SEM 10 emits an electron beam (represented by the arrow(s)) from tip 11 towards a developed photoresist structure 12 on semiconductor substrate 14. The developed photoresist structure 12 has an accumulation of negative charge 16 as a result of the lithography process. Due to repulsion between the electron beam and the negative charge 16 of the developed photoresist structure 12, the electron beam path is altered away from the developed photoresist structure 12 without having reflected off or contacting the developed photoresist structure 12. Since the electron beam does not reflect off of the developed photoresist structure 12, an accurate measure/profile of the structure cannot be obtained. Detection of the altered electron beams by detector 18 of SEM 10 provides data indicating at least one of inaccurate linewidth, fuzzy corner definition, and otherwise non-focused images. Assessment of the quality and parameters of a lithography process is consequently difficult or inaccurate and often impossible.

Referring to FIG. 2, SEM 10 emits an electron beam (represented by the arrow(s)) from tip 11 towards a developed photoresist structure 12 on semiconductor substrate 14. The developed photoresist structure 12 has an accumulation of negative charge 16 as a result of the lithography process and/or repeated use as a standard. Due to the negative charge 16 of the developed photoresist structure 12, the secondary electron signal is reduced; that is, the accumulation of negative charges 16 interferes with the ability of the electron beam to neatly reflect off of and be received by detector 18 of SEM 10.

This is especially true with regard to measuring linewidth and with using photoresists sensitive to small wavelengths of light. Photoresists sensitive to relatively small wavelengths of light are typically formed or developed into finer patterns (e.g., smaller linewidths) compared to photoresists sensitive to relatively large wavelengths of light. Linewidth measurements taken on undesirably charged photoresists often yield parameters in error, sometimes by an order of magnitude. For example, an SEM scanning an undesirably charged photoresist having a linewidth of 0.20 µm may incorrectly indicate that the linewidth is 0.24 µm. This is primarily due to charge induced deviation of the electron beam used to measure the linewidth. Such errors cannot be tolerated because they lead to fatal construction errors in subsequent processing.

Referring to FIG. 3, the critical dimension data graph of the developed photoresist of FIG. 1 using an SEM is shown by the solid line. An accurate measurement of the developed photoresist of FIG. 1 should yield the dashed line of FIG. 3, but due to undesirable charge accumulation, the apparent critical dimension is inaccurately wide. Accurate critical dimension measurements are desired.

SUMMARY OF THE INVENTION

The present invention provides improved methods and systems for evaluating a lithography process using an ionizer. The present invention also provides methods for minimizing charge accumulation and/or dissipating charge accumulation on a patterned photoresist, whether or not the photoresist is patterned over a wafer or a mask, using a feedback system wherein charge accumulation is addressed if detected. As a result of the present invention, evaluation of a patterned photoresist, such as linewidth measurement, profile data, corner sharpness, critical dimension determinations, and image inspection, is substantially improved. Subsequent processing of semiconductor substrates after lithography is accordingly improved.

One aspect of the present invention relates to a method of reducing electrostatic charges on a patterned photoresist to improve evaluation of the developed photoresist, involving the steps of evaluating the patterned photoresist to determine if electrostatic charges exist thereon; positioning an ionizer near the patterned photoresist, the ionizer generating ions thereby reducing the electrostatic charges on the patterned photoresist; and evaluating the patterned photoresist with an electron beam.

Another aspect of the present invention relates to a method of reducing negative charges on a developed photoresist to improve evaluation of the developed photoresist, involving the steps of providing a photoresist on a semiconductor structure; exposing the photoresist with radiation having a wavelength of about 400 nm or less, such as about 365 nm, about 248 nm, about 193 nm, and about 157 nm; developing the photoresist; evaluating the developed photoresist to determine if negative charges exist thereon; positioning an ionizer generating positive ions near the developed photoresist to provide a developed photoresist having a reduced amount of negative charges thereon; and evaluating the developed photoresist with one of a scanning electron microscope and an atomic force microscope.

Yet another aspect of the present invention relates to a system for reducing electrostatic charges on a patterned photoresist, containing a charge sensor for determining if electrostatic charges exist on the patterned photoresist and measuring the electrostatic charges; an ionizer positioned near the patterned photoresist having electrostatic charges thereon for reducing the electrostatic charges on the patterned photoresist; a controller for setting at least one of time of ion generation and amount of ion generation by the ionizer, the controller coupled to the charge sensor and the ionizer; and a scanning electron microscope or an atomic force microscope for evaluating the patterned photoresist having reduced electrostatic charges thereon with an electron beam.

Still yet another aspect of the present invention relates to a system for reducing negative charges on a developed photoresist to improve evaluation of the developed photoresist, containing a development chamber for developing a photoresist; a scanning electron microscope or an atomic force microscope comprising an evaluation chamber, for evaluating the developed photoresist with an electron beam; a track system for transporting the developed photoresist from the development chamber to the evaluation chamber; a charge sensor for determining if negative charges exist on the developed photoresist and measuring the negative charges; an ionizer positioned within about 2 meters from at least one of the development chamber, the evaluation chamber, and the track system, the ionizer generating positive ions thereby reducing the negative charges on the developed photoresist; and a microprocessor-controller for setting at least one of time of ion generation and amount of ion generation by the ionizer, the microprocessor-controller coupled to the charge sensor and the ionizer.

DISCLOSURE OF INVENTION

The present invention involves improving the development and evaluation of a photoresist by reducing undesirable charge accumulation and/or dissipating charge accumulation on a patterned photoresist. The present invention more specifically involves employing an ionizer which effectively reduces/dissipates the accumulation of negative charges on the patterned photoresist, whether or not the photoresist is patterned over a wafer or a mask. Reducing/dissipating negative electric charges on the patterned photoresist enables the accurate evaluation of the patterned photoresist using an electron beam, such as that generated by a SEM or an AFM. In particular, an electron beam directed at the patterned photoresist is not deflected or repelled by negative charges nor does it generate undesirable secondary electron signals. Instead, the electron beam generates a secondary electron signal that is accurately detected by a detector.

Figure 4:
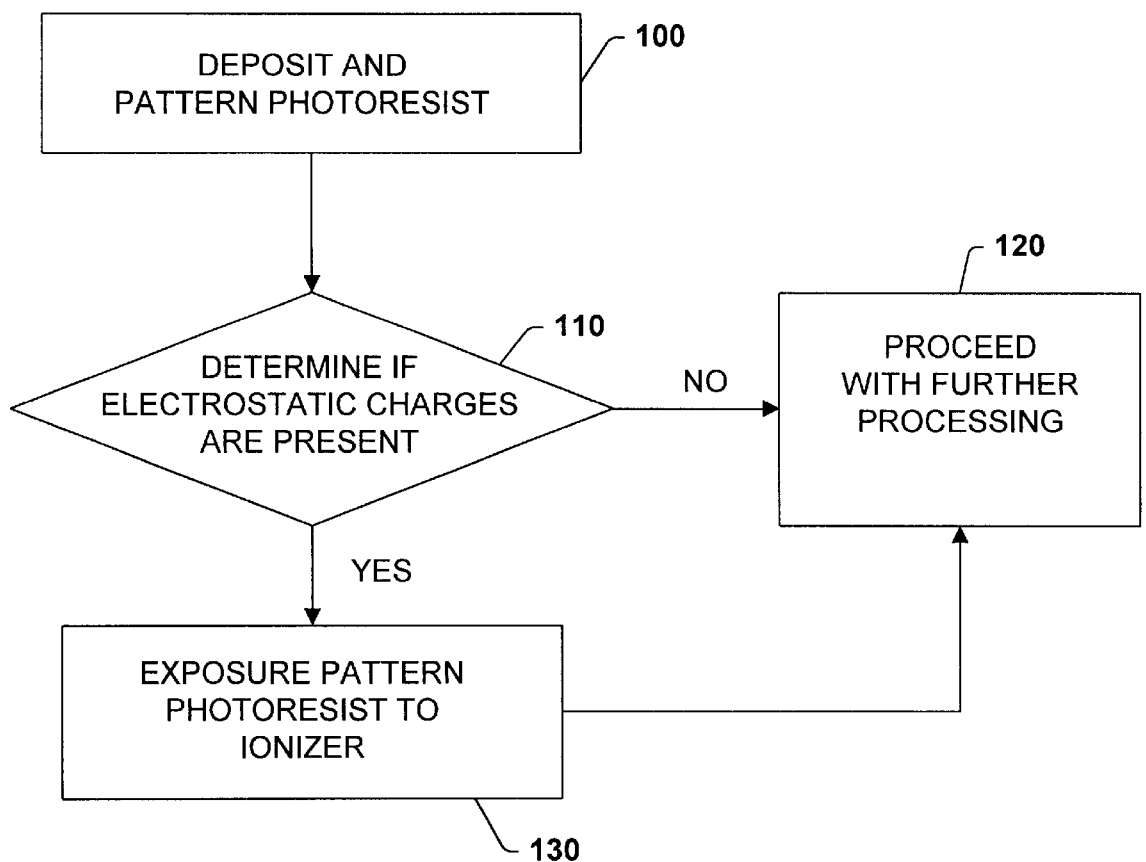
FIG. 4, is a flow diagram illustrating one aspect of the present invention.

The present invention can be understood by referring to FIG. 4. FIG. 4 generally shows the steps associated with the methods/systems of the present invention. Initially, a photoresist is deposited and patterned over a a substrate 100.

In particular, a photoresist is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. Alternatively, the substrate may include a mask, such as quartz substrate having a metal layer thereover. The photoresist is provided over at least a portion of the substrate, but typically over the entire substrate.

The photoresist may be applied to the substrate surface by any suitable means, such as spin-coating. Spin-coating involves depositing the photoresist in a solution over a spinning substrate. The centrifugal forces of the spinning substrate serve to evenly distribute the photoresist over the substrate. Any photoresist may be applied to the substrate surface. For example, a 157 nm sensitive photoresist, a 193 nm sensitive photoresist, an I-line, H-line, G-line, E-line, deep UV, extreme UV, X-ray resist, electron beam resist or chemically amplified photoresist material may be spin-coated on the substrate surface.

Positive or negative photoresists may be used, but positive photoresists are preferred. Photoresists are commercially available from a number of sources, including Shipley Company, DuPont, Arch Chemical, Aquamer, Hunt, Hoechst Celanese Corporation, Clariant, JSR Microelectronics, and Brewer. The photoresist is typically applied to a thickness from about 200 Å to about 30,000 Å, although the thickness of the photoresist is not critical to the invention.

In one embodiment, the photoresist is sensitive to relatively short wavelengths of light. For purposes of this invention, short wavelengths of light include those of about 400 nm or less, such as about 365 nm, about 248 nm, about 193 nm, and about 157 nm. In another embodiment, short wavelengths of light include those of about 250 nm or less. In these embodiments, the thickness of the photoresist is from about 200 Å to about 20,000 Å.

Optionally after the photoresist is applied to the substrate surface, the photoresist covered substrate is subjected to a soft bake to drive off excess solvent and/or to increase adhesion with the substrate surface. The soft bake involves heating at an elevated temperature for a suitable period of time.

The photoresist covered substrate is selectively exposed to actinic radiation to cause a chemical transformation in desired regions of the photoresist. A mask is typically employed to selectively expose the conductive photoresist. The wavelength of the actinic radiation employed depends primarily upon the components of the photoresist.

The selectively exposed photoresist is developed using a suitable developer, such as an aqueous developer. The specific identity of the developer is not critical to the invention, but typically an aqueous alkaline solution is employed. For example, in one aspect of the present invention, an aqueous tetramethylammonium hydroxide is employed as a developer solution. The developer solution is deposited over a spinning photoresist covered substrate. The spinning action serves to uniformly spread the developer over and then off of the photoresist covered substrate. Development may further involve rinsing the photoresist covered substrate with a rinsing solution, such as deionized water. Water is deposited over a spinning photoresist covered substrate, where the spinning action serves to uniformly spread the water or rinse solution over and then off of the photoresist covered substrate.

During development, either the exposed portion of the photoresist (in embodiments where a positive photoresist is employed) or the unexposed portion of the photoresist (in embodiments where a negative photoresist is employed) is soluble or is solubilized in the developing solution. The portion of the photoresist that is not substantially soluble in the developing solution remains on the substrate. Development results in a patterned photoresist (the remaining portion of the photoresist) over the substrate surface. Due to the lithography processing, and especially the spin cycles, electrostatic charges may develop and accumulate on the patterned photoresist. More particularly, negative charges may accumulate on the patterned photoresist.

The patterned photoresist is next evaluated to determine if indeed electrostatic charges have accumulated thereon 110. If it is determined that electrostatic charges have accumulated or exist on the patterned photoresist, a determination is made to approximate the magnitude of the accumulated electrostatic charges. Determining whether electrostatic charges exist and their approximate magnitude is accomplished using a measuring device, such as an electrostatic charge sensor having a probe, or an electrostatic charge meter. Preferably, electrostatic charges are measured at a plurality of locations on the wafer or mask (using a multiple point test). The electrostatic charge sensor can measure the charges on the patterned photoresist. The measuring device, such as the electrostatic charge sensor, may be coupled to a microprocessor-controller which automatically sets the amount of ions generated and/or the time of ion generation for neutralizing charges on the patterned photoresist, as more fully described below.

After the development or formation is completed, and if it is determined that electrostatic charges have not accumulated on the patterned photoresist, the patterned photoresist covered substrate proceeds with further semiconductor processing 120 (such as using the patterned photoresist to pattern the layer thereunder, to selectively dope a layer thereunder, or to selectively deposit a patterned layer). In this connection, the feedback system need not treat the patterned photoresist.

After the development or formation is completed, and if it is determined that electrostatic charges have accumulated on the patterned photoresist, the patterned photoresist covered substrate then is positioned near at least one ionizer (or at least one ionizer is positioned near the patterned photoresist covered substrate) 130.

Since the electrostatic charge sensor may be coupled to a microprocessor-controller, which in turn may be coupled to an ionizer and a track system, the present invention may comprises a closed loop feedback system for treating patterned photoresists when necessary (when the patterned photoresists have electrostatic charges). That is, as a result of feedback received from the electrostatic charge sensor, the microprocessor-controller indicates whether the patterned photoresist is treated or untreated by the ionizer. This facilitates automated processing of semiconductor and mask substrates.

In one embodiment, ionizers may be present in the spin cycle and/or electrostatic charge measurement chambers, and the ionizers may be activated after the spin cycles are completed or as the spin cycles are completed. In another embodiment, if the patterned photoresist covered substrate is processed on a track system (the track system transporting the substrate to various processing chambers), an ionizer may temporarily immediately precede or follow the patterned photoresist covered substrate on the track system to the inspection station. In yet another embodiment, if the patterned photoresist covered substrate is processed on a track system, the patterned photoresist covered substrate may pass through an area where at least one ionizer is positioned near the track. In still yet another embodiment, the patterned photoresist covered substrate is transferred to a chamber containing at least ionizer. In another embodiment, the patterned photoresist covered substrate proceeds to a measurement chamber (such as an AFM or SEM chamber), and ionizers may be present in the measurement chamber.

The ionizer generates ions that neutralize charges that accumulate on the patterned photoresist. For example, the ionizer generates positive ions that neutralize negative charges that accumulate on the patterned photoresist. The ionizer may generate positive ions and/or negative ions, depending on the nature of the charges on the patterned photoresist, although in most instances, it is necessary for the ionizer to generate positive ions. Any suitable ionizer may be employed in the present invention, including DC and AC type ionizers. Ionizers are known and are commercially available. The ions may be generated continuously or intermittently.

The term "positioned near" an ionizer (or the ionizer "positioned near" the patterned photoresist) means in a close enough proximity so that ions generated by the ionizer are capable of neutralizing charges that accumulate on the patterned photoresist. Thus, nearness depends upon a number of factors such as the strength of the ions generated by the ionizer, the amount of ions generated by the ionizer, the time of ion generation, the magnitude of the charges that accumulate on the patterned photoresist, the number of ionizers, and the like. In one embodiment, at least one ionizer is positioned within about 2 meters of the patterned photoresist covered substrate. In another embodiment, at least one ionizer is positioned within about 1 meter of the patterned photoresist covered substrate. In yet another embodiment, at least one ionizer is positioned within about 0.5 meters of the patterned photoresist covered substrate. In still yet another embodiment, at least one ionizer is positioned in the same processing chamber as the patterned photoresist covered substrate.

The ionizer generates ions for a time necessary to neutralize or reduce charges that accumulate on the patterned photoresist. The time depends upon a number of factors such as the proximity of the ionizer to the patterned photoresist, the strength of the ions generated by the ionizer, the amount of ions generated by the ionizer, the magnitude of the charges that accumulate on the patterned photoresist, the number of ionizers, and the like. A microprocessor-controller may facilitate appropriate neutralization. In one embodiment, the time the ionizer generates ions while it is positioned near the patterned photoresist is from about 1 second to about 10 minutes. In another embodiment, the time the ionizer generates ions while it is positioned near the patterned photoresist is from about 5 seconds to about 5 minutes. In yet another embodiment, the time the ionizer generates ions while it is positioned near the patterned photoresist is from about 10 seconds to about 2 minutes.

The ionizer generates an amount of ions sufficient to neutralize or reduce charges that accumulate on the patterned photoresist. The amount depends upon a number of factors such as the proximity of the ionizer to the patterned photoresist, the time of ion generation, the strength of the ions generated by the ionizer, the amount of ions generated by the ionizer, the magnitude of the charges that accumulate on the patterned photoresist, the number of ionizers, and the like. In one embodiment, the ionizer generates from about $10^2$ ions/cm$^3$ to about $10^6$ ions/cm$^3$. In another embodiment, the ionizer generates from about $5 \times 10^2$ ions/cm$^3$ to about $10^5$ ions/cm$^3$. In yet another embodiment, the ionizer generates from about $10^3$ ions/cm$^3$ to about $10^4$ ions/cm$^3$.

Comparing a patterned photoresist processed in accordance with the present invention with a patterned photoresist processed without an ionizer, the patterned photoresist processed in accordance with the present invention has at least about 50% less negative charge (for example, in volts) than the patterned photoresist processed without an ionizer under comparable circumstances. In another embodiment, the patterned photoresist processed in accordance with the present invention has at least about 75% less negative charge than the patterned photoresist processed without an ionizer under comparable circumstances. In yet another embodiment, the patterned photoresist processed in accordance with the present invention has at least about 90% less negative charge than the patterned photoresist processed without an ionizer under comparable circumstances. In still yet another embodiment, the developed photoresist has no detectable negative charge (is electrically neutral) when processed in accordance with the present invention.

Figure 5:
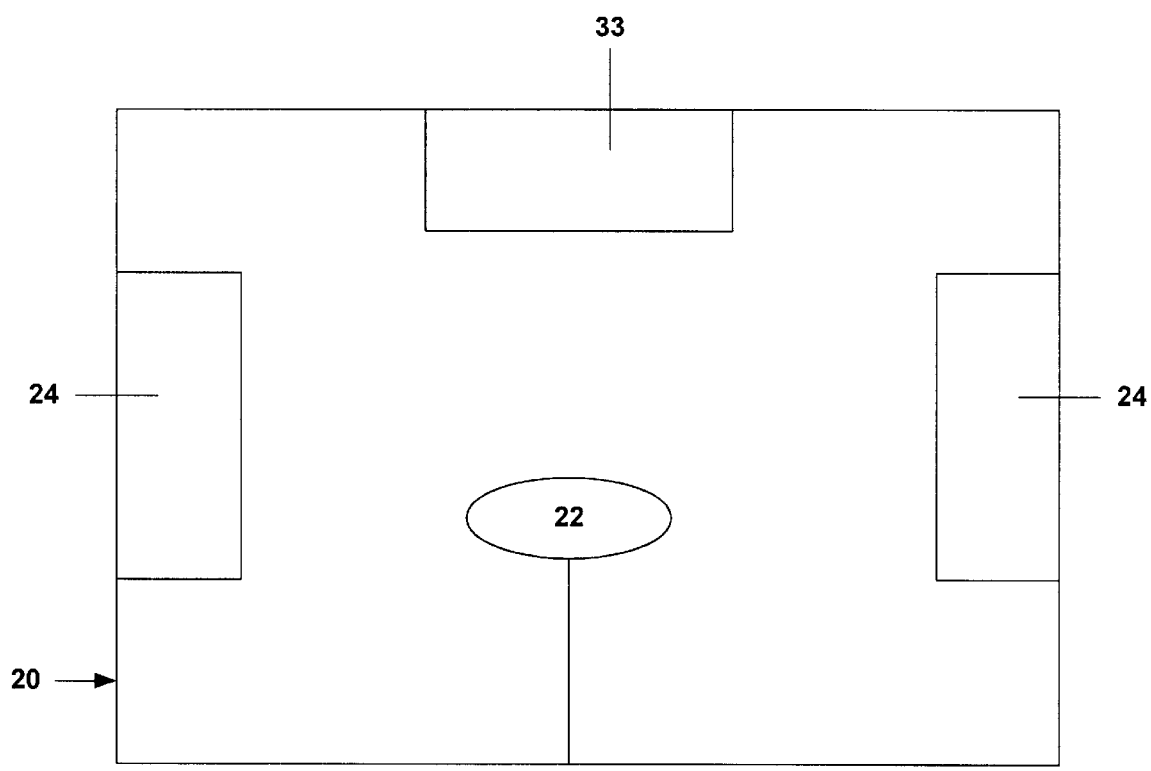
FIG. 5 is a schematic illustration of one aspect of using an ionizer in accordance with the present invention.
Figure 12:
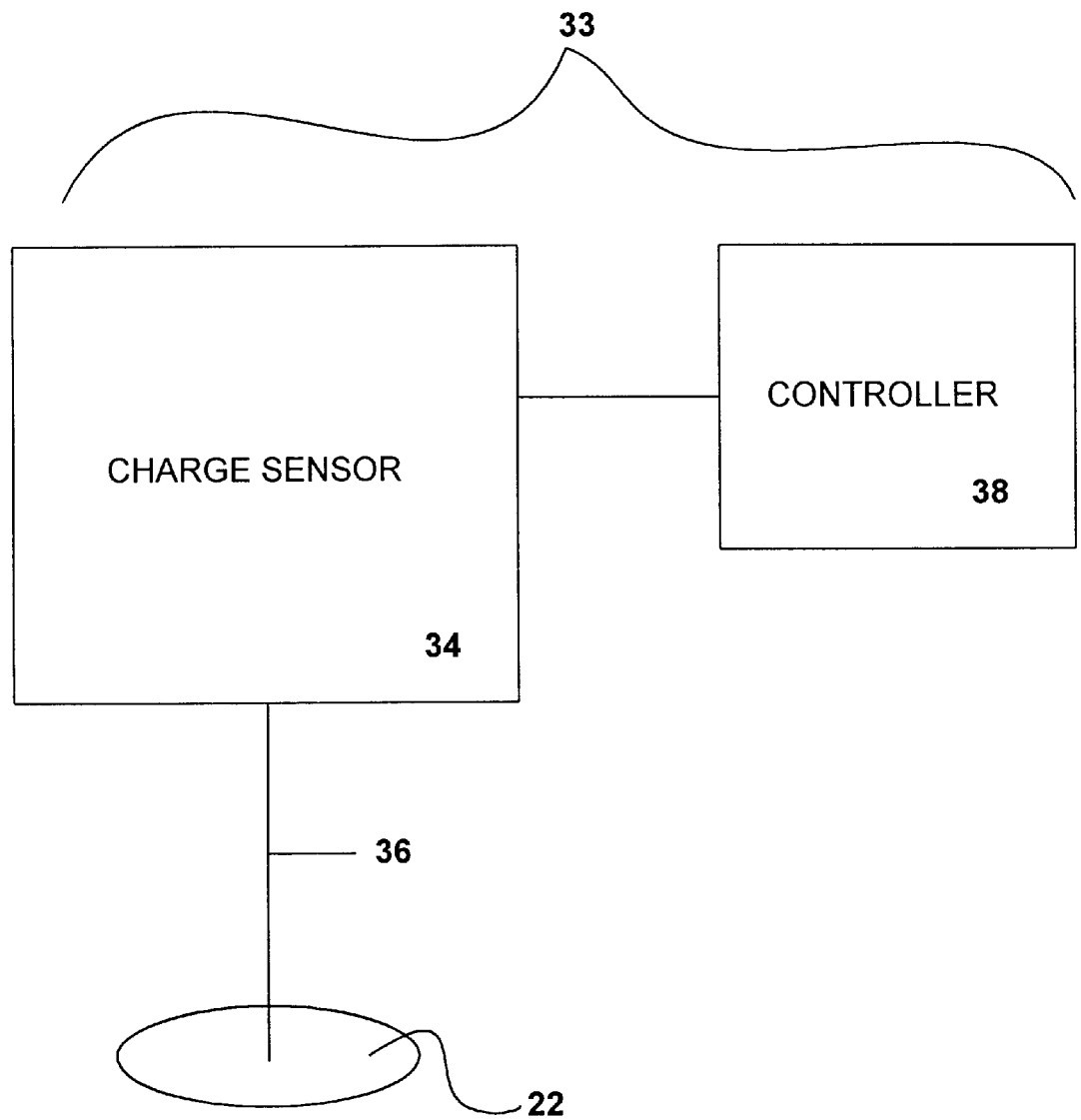
FIG. 12 is a schematic view of a developed photoresist detection scheme using a charge sensor in accordance with one aspect of the present invention.

Referring to FIGS. 5 and 12, one aspect of the present invention is illustrated. FIG. 5 shows a development processing chamber 20 contains patterned resist covered wafer 22 as it finishes spinning (spinning shown by the arrows) (the spinning may be associated with deposition of developer and/or developer rinse). Patterned resist covered wafer 22 may alternatively be a patterned resist covered mask (partially completed mask). Development processing chamber 20 further contains one or more ionizers 24 that produce ions that reduce charges accumulated on the patterned resist covered wafer 22 and a charge sensing system 33 for detecting and measuring electrostatic charges. FIG. 12 shows a charge sensing system 33 including a charge sensor 34 having a probe 36 that measures the accumulated electrostatic charges, if any, on a patterned photoresist covered wafer 22 (the patterned photoresist is not explicitly shown). The charge sensor 34 is coupled to a controller 38 capable of determining conditions (such as amount and time) associated with the subsequent generation of ions required to reduce, minimize and/or eliminate the electrostatic charges. If charge sensor 34 does not detect any accumulated electrostatic charges, the patterned photoresist covered wafer 22 may proceed to further semiconductor processing. If, to the contrary, charge sensor 34 detects accumulated electrostatic charges, ions are generated by one or more ionizers 24 (not shown) under conditions set by the controller 23. Although not shown, the ionizers 24 of FIG. 5 may be coupled to the controller 38 of FIG. 12.

Figure 6:
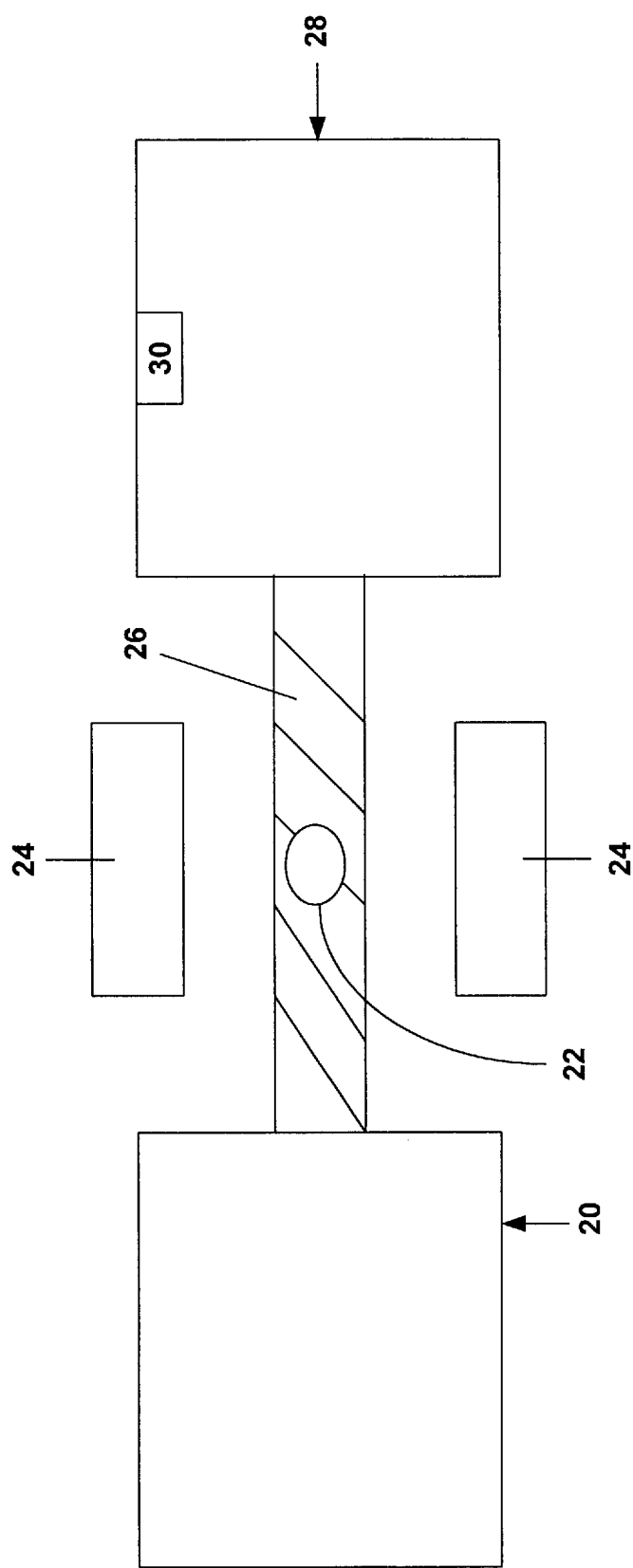
FIG. 6, is a schematic illustration of another aspect of using an ionizer in accordance with the present invention.

Referring to FIGS. 6 and 12, another aspect of the present invention is illustrated. FIG. 6 shows patterned resist covered wafer 22 is removed from the development processing chamber 20 and transported to an inspection chamber 28 containing an SEM 30 along a track system 26. Patterned resist covered wafer 22 may alternatively be a patterned resist covered mask. Patterned resist covered wafer 22 is evaluated for electrostatic charges using the charge sensing system 33 of FIG. 12. If charge sensor 34 does not detect any accumulated electrostatic charges, the patterned photoresist covered wafer 22 may proceed to inspection and/or further semiconductor processing. If, to the contrary, charge sensor 34 detects accumulated electrostatic charges, as the patterned resist covered wafer 22 is transported to the inspection chamber 28, it passes by at least one ionizer 24 positioned near the track system 26 (and thus the patterned resist covered wafer 22) that generates ions that reduce charges accumulated on the patterned resist covered wafer 22. Although not shown, the ionizers 24 of FIG. 6 may be coupled to the controller 38 of FIG. 12.

Figure 7:
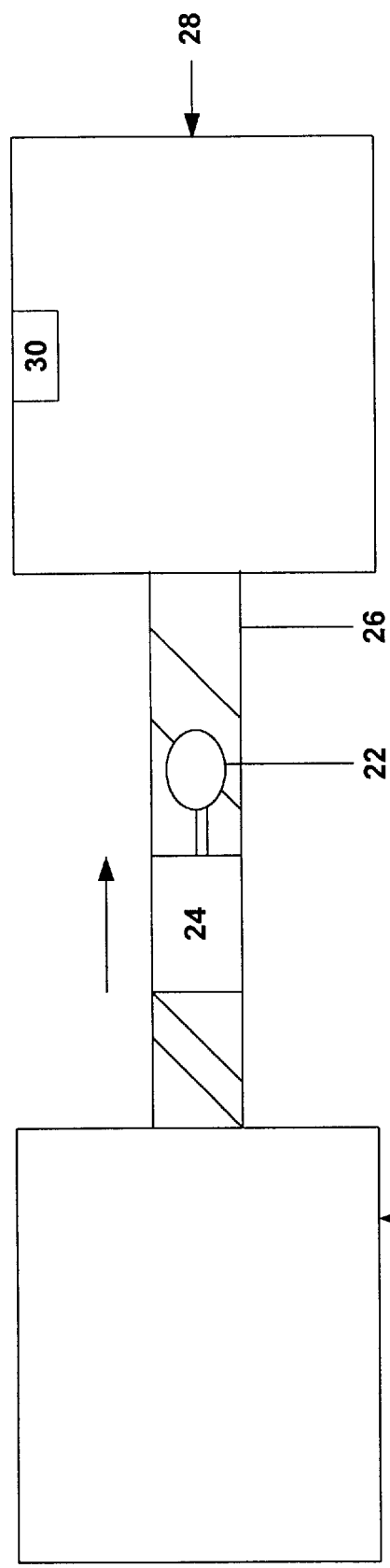
FIG. 7 is a schematic illustration of yet another aspect of using an ionizer in accordance with the present invention.

Referring to FIGS. 7 and 12, yet another aspect of the present invention is illustrated.

FIG. 7 shows that a patterned resist covered wafer 22 is removed from the development processing chamber 20 and transported to an inspection chamber 28 containing an SEM 30 along a track system 26. Patterned resist covered wafer 22 may alternatively be a patterned resist covered mask. Patterned resist covered wafer 22 is evaluated for electrostatic charges using the charge sensing system 33 of FIG. 12. If charge sensor 34 does not detect any accumulated electrostatic charges, the patterned photoresist covered wafer 22 may proceed to inspection and/or further semiconductor processing. At least one ionizer 24 is coupled with the patterned resist covered wafer 22 on the track system 26 as it is transported to the inspection chamber 28. If, to the contrary, charge sensor 34 detects accumulated electrostatic charges, as the patterned resist covered wafer 22 is transported to the inspection chamber 28, the ionizer 24 generate ions that reduce charges accumulated on the patterned resist covered wafer 22. Although not shown, the ionizer 24 of FIG. 7 may be coupled to the controller 38 of FIG. 12.

Figure 8:
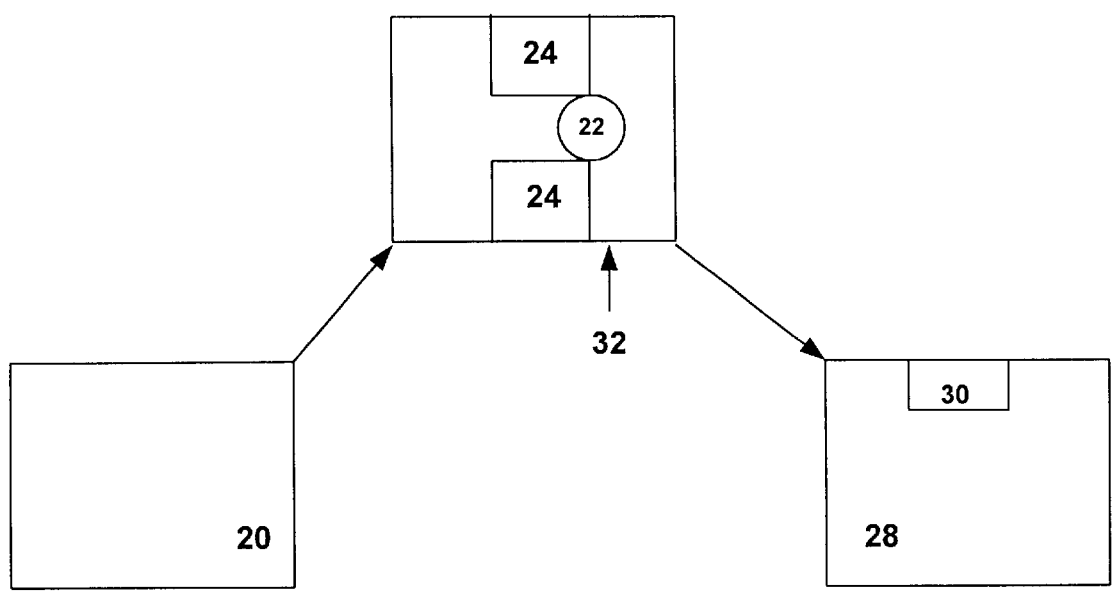
FIG. 8 is a schematic illustration of still yet another aspect of using an ionizer in accordance with the present invention.

Referring to FIGS. 8 and 12, still yet another aspect of the present invention is illustrated. FIG. 8 shows that a patterned resist covered wafer 22 is removed from the development processing chamber 20 and transported to an ionization chamber 32 containing at least one ionizer 24 as shown by the arrow. Patterned resist covered wafer 22 may alternatively be a patterned resist covered mask. Patterned resist covered wafer 22 is evaluated for electrostatic charges using the charge sensing system 33 of FIG. 12. If charge sensor 34 does not detect any accumulated electrostatic charges, the patterned photoresist covered wafer 22 may proceed to inspection and/or further semiconductor processing. If, to the contrary, charge sensor 34 detects accumulated electrostatic charges, the ionizers 24 generate ions that reduce charges accumulated on the patterned resist covered wafer 22. The patterned resist covered wafer 22 is then removed from the ionization chamber 32 and transported to an inspection chamber 28 containing an SEM 30 as shown by the arrow. Although not shown, the ionizers 24 of FIG. 8 may be coupled to the controller 38 of FIG. 12.

Figure 9:
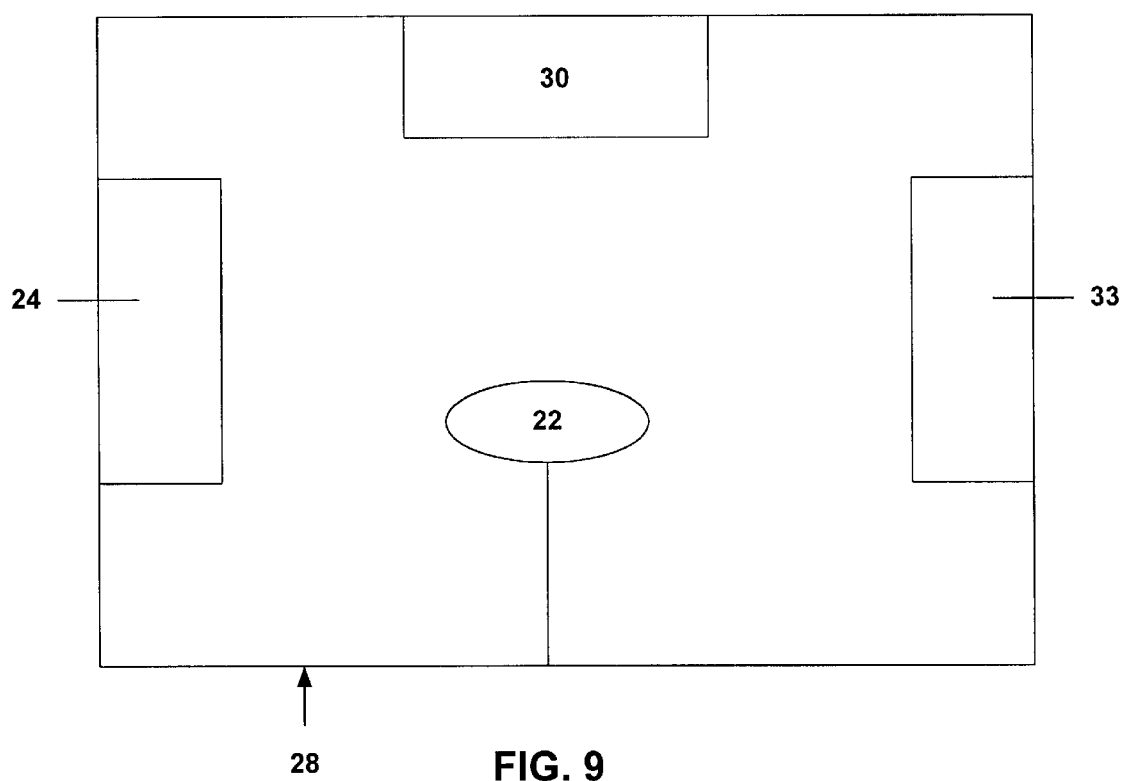
FIG. 9 is a schematic illustration of still another aspect of using an ionizer in accordance with the present invention.

Referring to FIG. 9, still another aspect of the present invention is illustrated. Patterned resist covered wafer 22 is placed in an inspection chamber 28 containing an SEM 30, a charge sensing system 33 and at least one ionizer 24. Patterned resist covered wafer 22 may alternatively be a patterned photoresist covered mask. Patterned resist covered wafer 22 is evaluated for electrostatic charges using the charge sensing system 33 of FIG. 12. If charge sensor 34 does not detect any accumulated electrostatic charges, the patterned photoresist covered wafer 22 may proceed to inspection using the SEM 30. If, to the contrary, charge sensor 34 detects accumulated electrostatic charges, the ionizers 24 generate ions that reduce charges accumulated on the patterned resist covered wafer 22. This improves subsequent inspection using the SEM 30. Although not shown, the ionizers 24 of FIG. 9 may be coupled to the controller 38 of FIG. 12.

Figure 1:
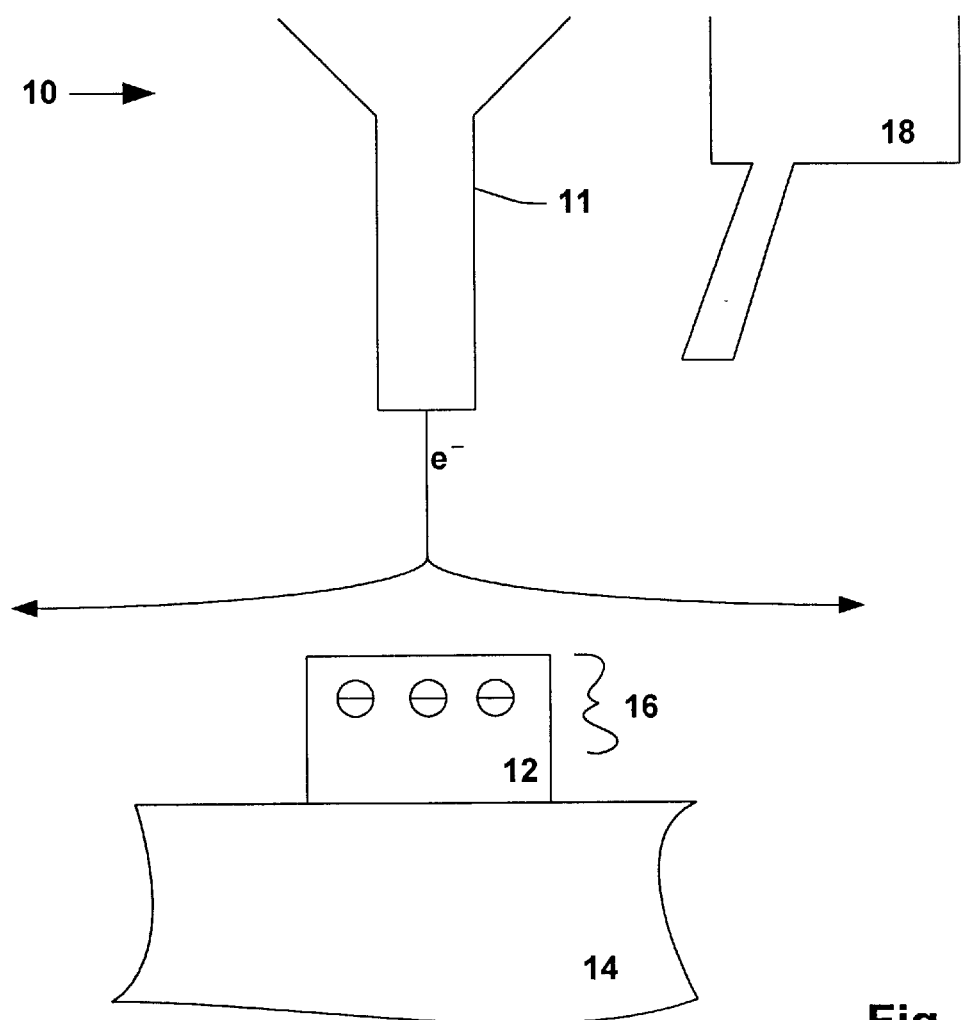
FIG. 1 is a view of a prior art developed photoresist detection scheme using an SEM.
Figure 2:
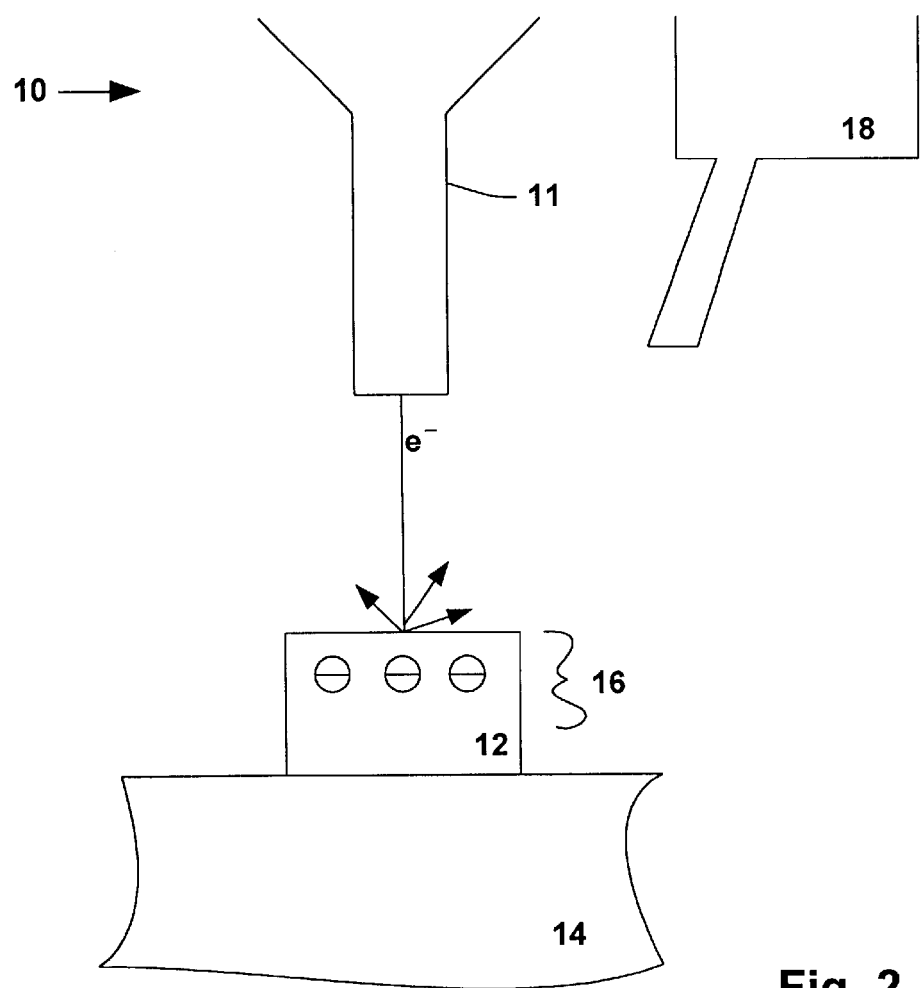
FIG. 2 is a view of a prior art developed photoresist detection scheme using an SEM.
Figure 3:
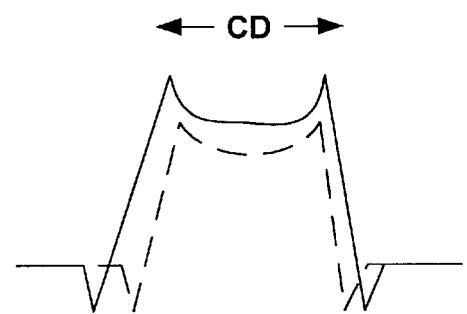
FIG. 3 is a critical dimension data graph of the prior art developed photoresist of FIG. 1 using an SEM.

Employing the ionizer, accumulated negative charges on the patterned photoresist are reduced, dissipated, minimized and/or eliminated. As a result, subsequent processing of the substrate is facilitated. Especially when evaluating the developed photoresist with an electron beam, such as from an SEM or AFM, processing is enhanced. For example, referring to FIG. 10, subsequent processing involving inspection/measurement is shown, wherein like elements are represented with like numerals in relation to FIG. 1. Even in instances where the SEM 30 contributes to the accumulation of electrostatic charges on the patterned resist covered wafer 22 as in FIG. 9, the ionizer 24 can be employed to correct this undesirable phenomenon.

Figure 10:
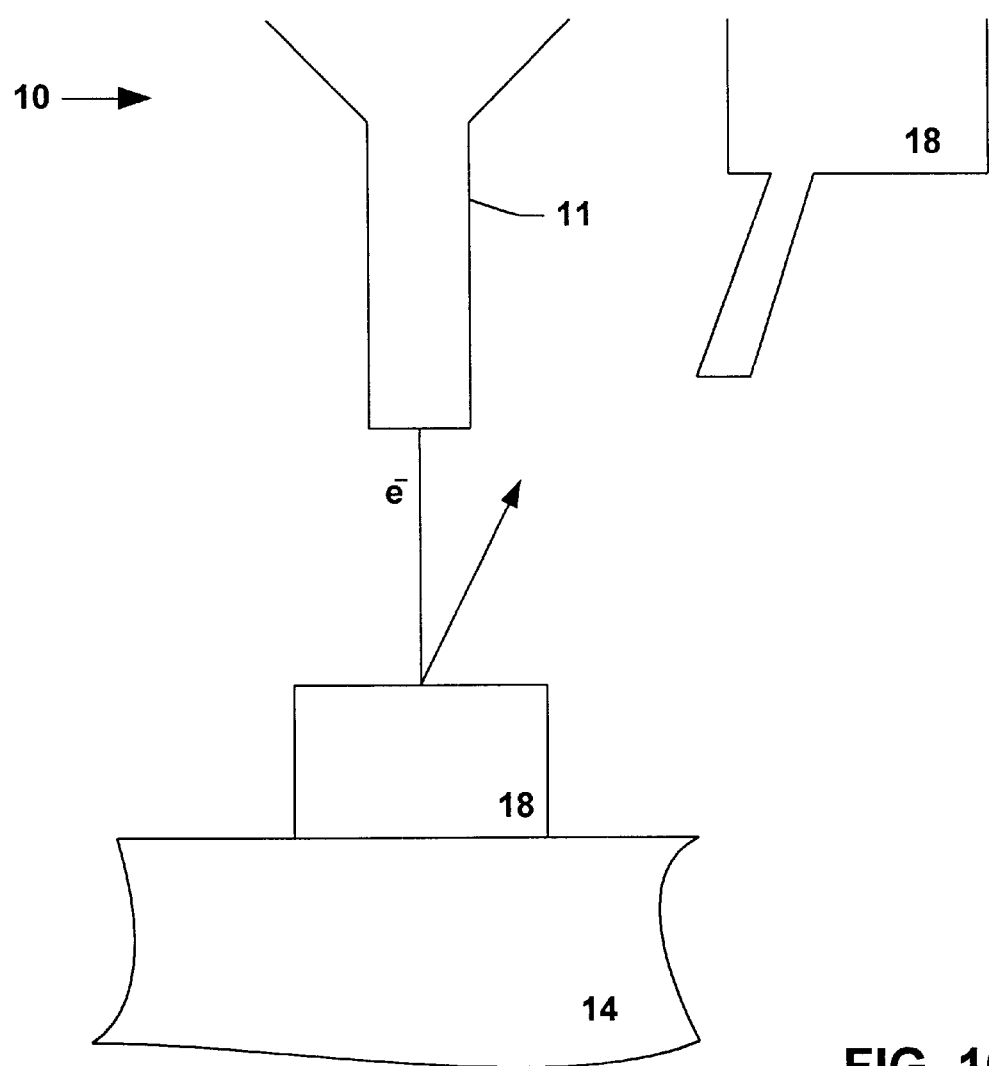
FIG. 10 is a view of a developed photoresist detection scheme using an SEM in accordance with.one aspect of the present invention.

In FIG. 10, SEM 10 emits an electron beam (represented by the arrow) towards a developed photoresist structure 18 on semiconductor substrate 14. The electron beam generates a secondary electron signal off of the developed photoresist structure 18 that is detected by a detector (not shown) of the SEM. Since the negative charges that may have accumulated on the developed photoresist 18 surface are eliminated by the present invention, the electron beam from SEM 10 is not repelled or deflected, and secondary electron signals are not interfered with or altered, but instead detected from the developed photoresist 18. Consequently, an accurate measurement of the linewidth, sharp corner definition, focused structural details and/or accurate profile data (or other evaluation data) of the developed photoresist 18 may be obtained. Assessment of the quality and parameters of a lithography process is consequently improved by the present invention.

Figure 11:
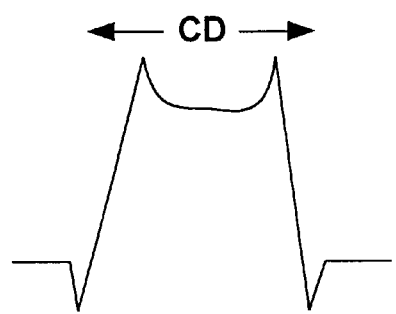
FIG. 11 is a critical dimension data graph of the developed photoresist of FIG. 8 using an SEM in accordance with one aspect of the present invention.

Referring to FIG. 11, the critical dimension data graph of the developed photoresist of FIG. 10 using an SEM is shown by the solid line. The critical dimension measurement of the developed photoresist of FIG. 10 is accurate since charge accumulation on the developed photoresist is minimized and/or eliminated because an ionizer is employed.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of reducing electrostatic charges on a patterned photoresist to improve evaluation of the developed photoresist, comprising:

providing a photoresist on a semiconductor structure;

exposing the photoresist with radiation having a wavelength of about 250 nm or less;

developing the photoresist;

evaluating the patterned photoresist to determine if negative electrostatic charges exist thereon;

positioning an ionizer near the patterned photoresist so that ions generated by the ionizer are capable of neutralizing electrostatic charges that accumulate on the patterned photoresist, the ionizer generating positive ions thereby reducing the electrostatic charges on the patterned photoresist; and evaluating the patterned photoresist with an electron beam.

2. The method of claim 1, wherein the ionizer is positioned within about 2 meters of the patterned photoresist, and the ionizer generates ions for a time from about 1 second to about 10 minutes.

3. The method of claim 1, wherein the ionizer generates from about $10^2$ ions/cm$^3$ to about $10^6$ ions/cm$^3$.

4. The method of claim 1, wherein the patterned photoresist is positioned over a wafer or a mask.

5. The method of claim 1, wherein evaluating the patterned photoresist with the electron beam involves at least one of making a linewidth measurement, generating profile data, determining corner sharpness, determining critical dimension control, and making an image of the developed photoresist.

6. The method of claim 1, wherein the electron beam is generated from a scanning electron microscope or an atomic force microscope.

7. A method of reducing negative charges on a developed photoresist to improve evaluation of the developed photoresist, comprising:

providing a photoresist on a semiconductor structure;

exposing the photoresist with radiation having a wavelength of about 370 nm or less;

developing the photoresist;

evaluating the developed photoresist to determine if negative charges exist thereon and measuring the negative charges;

positioning an ionizer generating an amount of positive ions within about 2 meters the developed photoresist to neutralize the negative charges; and evaluating the developed photoresist with one of a scanning electron microscope and an atomic force microscope.

8. The method of claim 7, wherein the ionizer is positioned within about 1 meter of the developed photoresist, and the ionizer generates ions for a time from about 5 seconds to about 5 minutes.

9. The method of claim 7, wherein the ionizer generates from about $5 \times 10^2$ ions/cm$^3$ to about $10^5$ ions/cm$^3$.

10. The method of claim 7, wherein the semiconductor structure is a silicon wafer or a quartz mask.

11. A system for reducing negative electrostatic charges on a patterned photoresist, comprising:

a charge sensor for determining if negative electrostatic charges exist on the patterned photoresist and measuring the negative electrostatic charges, the patterned photoresist formed using radiation having a wavelength of about 250 nm or less;

an ionizer for reducing the electrostatic charges on the patterned photoresist, the ionizer positioned in a close proximity so that ions generated by the ionizer are capable of neutralizing electrostatic charges that accumulate on the patterned photoresist;

a controller for setting at least one of time of positive ion generation and amount of positive ion generation by the ionizer, the controller coupled to the charge sensor and the ionizer; and a scanning electron microscope or an atomic force microscope for evaluating the patterned photoresist having reduced negative electrostatic charges thereon with an electron beam.

12. The system of claim 11, wherein the patterned photoresist having negative electrostatic charges thereon is transported through the system by a track system.

13. The system of claim 11, wherein the ionizer is positioned at one of in a development chamber;

adjacent a track system for transporting the patterned photoresist having negative electrostatic charges thereon through the system;

on the track system for transporting the patterned photoresist having negative electrostatic charges thereon through the system; or in an evaluation chamber.

14. A system for reducing negative charges on a developed photoresist to improve evaluation of the developed photoresist, comprising:

a development chamber for developing a photoresist using radiation having a wavelength of about 370 nm or less;

a scanning electron microscope or an atomic force microscope comprising an evaluation chamber, for evaluating the developed photoresist with an electron beam;

a track system for transporting the developed photoresist from the development chamber to the evaluation chamber;

a charge sensor for determining if negative charges exist on the developed photoresist and measuring the negative charges;

an ionizer positioned within about 2 meters from at least one of the development chamber, the evaluation chamber, and the track system, the ionizer generating positive ions thereby reducing the negative charges on the developed photoresist; and a microprocessor-controller for setting at least one of time of ion generation and amount of ion generation by the ionizer, the microprocessor-controller coupled to the charge sensor and the ionizer.

15. The system of claim 14, wherein the ionizer is positioned within about 1 meter from at least one of the development chamber, the evaluation chamber, and the track system.

16. The system of claim 14, wherein the ionizer is positioned within about 0.5 meters from at least one of the development chamber, the evaluation chamber, and the track system.

17. The system of claim 14, wherein the ionizer is positioned within the development chamber or the evaluation chamber.

18. The system of claim 14, wherein the photoresist is one of a deep ultraviolet photoresist, an extreme ultraviolet photoresist, an X-ray photoresist, and an electron beam photoresist.

* * * * *